United States Patent [19]

Nakashima et al.

[11] Patent Number: 5,717,252
[45] Date of Patent: Feb. 10, 1998

[54] SOLDER-BALL CONNECTED SEMICONDUCTOR DEVICE WITH A RECESSED CHIP MOUNTING AREA

[75] Inventors: Takashi Nakashima; Atsushi Fukui; Keiji Takai; Koji Tateishi, all of Kitakyushu, Japan

[73] Assignee: Mitsui High-tec, Inc., Japan

[21] Appl. No.: 757,639

[22] Filed: Dec. 2, 1996

Related U.S. Application Data

[63] Continuation of Ser. No. 432,928, May 1, 1995, abandoned.

[30] Foreign Application Priority Data

Jul. 25, 1994 [JP] Japan ................. 6-172656
Aug. 19, 1994 [JP] Japan ................. 6-195564
Nov. 11, 1994 [JP] Japan ................. 6-303075

[51] Int. Cl.[6] ................................................. H01L 23/34
[52] U.S. Cl. ...................... 257/707; 257/706; 257/738; 257/711; 257/730; 257/780; 257/784; 257/773
[58] Field of Search .................................. 257/780, 737, 257/738, 711, 730, 777, 778, 706, 707, 784, 773

[56] References Cited

U.S. PATENT DOCUMENTS

| | | | |
|---|---|---|---|
| 4,278,990 | 7/1981 | Fichot | 257/717 |
| 5,045,921 | 9/1991 | Lin et al. | 257/780 |
| 5,216,278 | 6/1993 | Lin et al. | 257/737 |
| 5,334,857 | 8/1994 | Mennitt et al. | 257/737 |
| 5,394,009 | 2/1995 | Loo | 257/780 |
| 5,409,865 | 4/1995 | Karnezos | 257/738 |
| 5,561,323 | 10/1996 | Andros et al. | 257/707 |
| 5,583,377 | 12/1996 | Higgins, III | 257/707 |
| 5,583,378 | 12/1996 | Marrs et al. | 257/730 |
| 5,598,321 | 1/1997 | Mosnafazadett et al. | 257/707 |

Primary Examiner—Tom Thomas
Assistant Examiner—David B. Hardy
Attorney, Agent, or Firm—Handal & Morofsky

[57] ABSTRACT

A semiconductor device which remains highly reliable and is easy to mount even when a bonding pad pitch is reduced. The semiconductor device is featured in that a thermally conductive support substrate in which a semiconductor chip is fixed to a recessed portion is mounted on the reverse side of an insulating tape, that is, a TAB substrate having a conductor pattern on the surface; and solder balls are placed on the front side of the insulating tape to ensure connection to the conductor pattern on the front side through holes.

9 Claims, 14 Drawing Sheets

SOLDER-BALL CONNECTED SEMICONDUCTOR DEVICE WITH A RECESSED CHIP MOUNTING AREA

This application is a Continuation of application Ser. No. 8/432,928, filed May 1, 1995, now abandoned.

BACKGROUND OF THE INVENTION

1. Technical Field

The present invention relates to a semiconductor device and to a method for manufacturing a semiconductor device, and in particular relates to mounting a semiconductor device using the SBC (Solder Ball Connecting) technique.

2. Background Art

IC, LSI, and other semiconductor devices are connected to circuit patterns on mounting substrates using solder or the like. In recent years, in response to the development of finer elements and miniaturized circuits, a so-called SBC technique has been proposed. It is a method in which the semiconductor packages on circuit substrates are connected using solder balls. This method has come to the fore because mounting can be easily accomplished by positioning semiconductors to circuit patterns on mounting substrates, then mounting, heating and fixing the device.

The example shown in FIG. 24 illustrates a so-called PBGA (Plastic Ball Grid Array) method, in which a semiconductor chip 102 is mounted on a PCB (Printed Circuit Board) substrate 101 having contact holes and provided with circuit patterns on both surfaces, electrical connections are made with the use of a wire 103, solder balls 104 are placed on the reverse side of the PCB substrate 101, and the front side is sealed with a sealing resin 105.

Another example, which is shown in FIG. 25, illustrates a so-called TBGA (Tape Ball Grid Array) method, in which a semiconductor chip 202 is connected "facedown" to a TAB (Tape Automated Bonding) tape 201 equipped with circuit patterns on both surfaces, a base 203 consisting of a metal plate is fixed with the use of an adhesive along the periphery thereof, solder balls 204 are placed on the reverse surface via contact holes H formed in the TAB tape 201, and the front side is sealed with a sealing resin 205.

A disadvantage of either method is the high cost brought about by the use of a TAB substrate or a PCB substrate having circuit patterns on both surfaces. Another disadvantage is that the pad pitch has been steadily shrinking in recent years from 75 μm to about 60 μm, making it difficult to align the circuit patterns on both surfaces by these two methods and to reduce the formation pitch of solder balls, with the result that these two methods cannot be used for connecting fine patterns.

Yet another disadvantage is the inadequacy of heat radiation properties observed during the mounting of elements characterized by substantial heat evolution, such as power elements.

Thus, the conventional methods are disadvantageous in that they impede the alignment of circuit patterns on both surfaces, bring about higher costs, and cannot be used with a reduced bonding pad pitch.

SUMMARY OF THE INVENTION

With the foregoing in view, it is an object of the present invention to provide a readily manufacturable semiconductor device which is highly reliable and easy to mount even when the bonding pad pitch is reduced.

In view of the above, a first distinctive feature of the present invention is that a semiconductor chip is mounted on a thermally conductive support substrate on which a recessed portion is formed, the insulating tape side of a TAB substrate is fixed to the semiconductor chip and the circumferential edge portion of the recessed portion of this support substrate and this semiconductor chip, an insulating film having holes is formed on the conductor pattern formation side of this TAB substrate, and solder balls are placed on the reverse side of this insulating film to ensure connection to the conductor pattern on the front side via the holes. Specifically, the first semiconductor device of the present invention comprises a support substrate in which a recessed portion is formed in a chip mounting area and which is formed of a thermally conductive material; a semiconductor chip fixed to the recessed portion of the support substrate with the use of an adhesive; a TAB substrate which consists of an insulating tape wherein a conductor pattern that is electrically connected to the semiconductor chip is supported on the front side, and in which the reverse side is fixed to the circumferential edge portion of the recessed portion of the support substrate; an insulating film for covering the conductor pattern formation side of the insulating tape; and solder balls which are connected to the conductor pattern via the contact holes formed in the insulating film and which are projected beyond the surface of the insulating film.

Preferably, the tip of the conductor pattern is extended directly above bonding pads of the semiconductor chip and is directly bonded to the bonding pads.

In addition, the conductor pattern is preferably connected to the bonding pads of the semiconductor chip via a bonding wire.

Furthermore, a second distinctive feature of the present invention is that a recessed portion is formed in a thermally conductive support substrate, a semiconductor chip is fixed to this recessed portion, a TAB substrate in which a conductor pattern has been formed on one surface is then fixed to the flat surface of the support substrate in such a way that the conductor pattern formation side faces outward, the conductor pattern side of the TAB substrate is additionally covered with an insulating film having holes, and solder balls are positioned to ensure connection with the conductor pattern on the front side through the holes. Specifically, the present invention comprises the following steps: a substrate formation step of preparing a thermally conductive support substrate in which a recessed portion is formed in a chip mounting area; a semiconductor chip mounting step of fixing a semiconductor chip to the recessed portion of the support substrate with the use of an adhesive; a TAB substrate formation step of preparing a TAB substrate in which a conductor pattern is formed on an insulating tape; a TAB substrate mounting step of fixing the TAB substrate to the support substrate to ensure electrical contact with the semiconductor chip; an insulating film formation step of forming thereon an insulating film having multiple holes; and a ball fixing step of placing solder balls on the insulating film, performing heating to unite the solder balls with the conductor pattern in the holes, and fixing the solder balls.

Preferably, the substrate formation step contains a step of drawing the metal substrate to form a recessed portion.

In addition, the insulating film formation step preferably contains a covering step of covering the surface of the insulating tape with a photosensitive resin film, and a perforation step of forming holes in prescribed areas of the photosensitive resin film by photolithography.

Furthermore, a third distinctive feature of the present invention is that the conductor pattern formation side of the TAB tape is fixed to a thermally conductive substrate in which a recessed portion is formed in the chip mounting area, and solder balls are fixed to the holes formed in the insulating tape of the TAB tape. Specifically, the device comprises a support substrate in which a recessed portion is formed in the chip mounting area and which is formed of a thermally conductive material; a semiconductor chip fixed to the recessed portion of the support substrate with the use of an adhesive; an insulating tape which is fixed to the circumferential edge portion of the recessed portion of the support substrate in such a way that the conductor pattern is positioned on the semiconductor chip mounting side, and which carries a conductor pattern electrically connected to the semiconductor chip; and solder balls which are connected to the conductor pattern via contact holes formed in the insulating tape and which are projected beyond the surface of the insulating tape.

Preferably, the conductor pattern is extended directly above the bonding pads of the semiconductor chip and is directly bonded to the bonding pads.

In addition, the conductor pattern is preferably connected to the bonding pads of the semiconductor chip via a bonding wire.

A fourth distinctive feature of the present invention is that a semiconductor chip is mounted on a TAB substrate in which a conductor pattern is formed on an insulating tape, and a thermally conductive support substrate in which a recessed portion is formed in the chip mounting area is then fixed in such a way as to cover both the semiconductor chip and the TAB substrate. Specifically, the manufacturing method comprises the following steps: a substrate formation step of preparing a thermally conductive support substrate in which a recessed portion is formed in a chip mounting area; a TAB substrate formation step of preparing a TAB substrate in which a conductor pattern is formed on an insulating tape; a semiconductor chip mounting step of mounting a semiconductor chip facedown (a bonding pad forming side of the chip is faced the conductor pattern) on the conductor pattern of the TAB substrate and accomplishing electrical connection by means of direct connection; a support substrate fixing step of fixing the semiconductor chip to the recessed portion of the support substrate with the use of an adhesive, and fixing the support substrate and the TAB substrate to each other with the use of an insulating adhesive; a perforation step of forming a plurality of holes in the insulating tape of the TAB substrate; and a ball fixing step of placing solder balls on the insulating tape, performing heating to unite the solder balls with the conductor pattern in the holes, and fixing the solder balls.

Furthermore, a fifth distinctive feature of the present invention is that it comprises an insulating tape having a plurality of holes and provided with a conductor pattern on a front surface thereof which is formed so as to cover at least mouths of these holes, a semiconductor chip fixed to the surface of the insulating tape and electrically connected to the conductor pattern, a metal substrate fixed to the area around the semiconductor chip on the surface of the insulating tape, and solder balls which are connected to the conductor pattern via the holes in the insulating tape and which are projected beyond the reverse side of the insulating tape.

Preferably, the semiconductor chip and the conductor pattern are connected together via a bonding wire, and the bonding wire and the surface of the semiconductor chip are covered with a sealing resin.

Another preferred feature is that the semiconductor chip is directly bonded to the conductor pattern.

A sixth distinctive feature of the present invention is that the device comprises a semiconductor chip; an insulating tape having an opening in an area where the semiconductor chip is to be mounted and carrying a conductor pattern on a reverse side thereof, the conductor pattern being extended into the opening toward bonding pads of the semiconductor chip and directly bonded to the bonding pads; a metal substrate adhered to a circumferential edge portion of the semiconductor chip on a chip mounting side of the insulating tape; an insulating film positioned on the reverse side of the insulating tape in such a way that the semiconductor chip and the insulating tape are covered; and solder balls which are connected to the conductor pattern via contact holes formed in the insulating film and which are projected beyond a surface of the insulating film.

A seventh distinctive feature of the present invention is that the device comprises a chip mounting substrate in which a chip mounting area is formed in the center and in which a plurality of solder ball terminals are formed on the reverse surface in positions outside the chip mounting area; a semiconductor chip which is mounted in the chip mounting area; a conductor pattern which is fixed to the chip mounting substrate and in which one end is connected to the solder ball terminals, and the other end is electrically connected to the semiconductor chip; and a resin sealing container molded using a mold in such a way that the semiconductor chip and at least a portion of the conductor pattern are covered.

Preferably, the chip mounting substrate is formed of a metal plate in which a semiconductor chip is mounted on the front side, and a conductor pattern is placed on the reverse side via an insulating sheet; wiring holes are formed in the metal plate and insulating sheet in such a way that the wire bonding area of the conductor pattern is exposed; and the semiconductor chip is connected to the conductor pattern by means of wire bonding via the wiring holes.

In addition, the resin sealing container is preferably formed only on the chip mounting side of the chip mounting substrate.

Another preferred feature is that the chip mounting substrate is formed of a metal plate in which the chip mounting area is a recessed portion subjected to depress processing.

Yet another preferred feature is that the chip mounting substrate be formed of a metal flat plate.

Still another preferred feature is that the chip mounting substrate is formed of a metal plate in which a semiconductor chip is mounted on the front side and a conductor pattern is placed around the chip via an insulating sheet, and the semiconductor chip is connected to the conductor pattern by means of wire bonding.

A further preferred feature is that the chip mounting substrate is formed of a metal plate in which the chip mounting area is a recessed portion subjected to depress processing, a plurality of perforated holes is formed around the recessed portion serving as the chip mounting area, and suspension leads are provided. It is noted that the holes may be formed by pressing, etching process, etc.

The first through fourth semiconductor devices described above offer very good heat radiation properties because of the mounting of a semiconductor chip on a recessed thermally conductive substrate such as a metal substrate. In addition, mounting is accomplished using an insulating tape, that is, a TAB substrate, in which a conductor pattern is formed on one surface, dispensing with the need for contact hole plating or for mask alignment between the patterns on the front and reverse surfaces, and limiting the operations to positioning solder balls in holes formed in the insulating tape or in an insulating film that covers this tape, and to fixing the solder balls to the surface of the conductor pattern by heating or the like, thus facilitating the manufacture, improving the accuracy, and lowering the cost. Furthermore, support strength is enhanced and reliability improved because the semiconductor chip mounting side is completely covered and protected by the support substrate.

Further, as similar to conventional lead frames, the thermally conductive substrate can be formed continuously from a metal strip (sheet) by carrying out press processing or the like in such a way that the continuously formed substrates are supported by side rails. This thermally conductive substrate can be produced extremely easily with the use of a conventional lead frame manufacturing apparatus, since the TAB connection processing and the solder ball connection processing can be carried out while the substrate are supported by the side rails, and the side rails can be cut off after the completion of these processing. In the same way, the TAB substrate may also be formed continuously.

In particular, the first semiconductor device of the present invention involves fixing solder balls inside the holes of an insulating film formed on the reverse side of a TAB substrate, thus making it possible to form fine solder balls with high accuracy and to reduce the pad pitch. Preferably, mounting is made much easier by extending the TAB substrate over the semiconductor chip and electrically connecting the substrate to the semiconductor chip by means of direct bonding. It is also possible to connect the TAB substrate and the semiconductor chip using wire bonding.

The method for manufacturing the second semiconductor device of the present invention makes it possible to perform mounting very easily by mounting a semiconductor chip on a recessed, thermally conductive substrate, then connecting a TAB substrate thereto, covering the product with an insulating film having holes while the surface remains in a flattened state, and fixing solder balls within the holes. Preferably, prior to forming the solder balls, a flux layer is formed inside the holes and the solder balls are placed on the flux layer and heated so as to be melted and united with the conductor pattern exposed inside the contact holes, hence the solder balls are selectively fixed only inside the contact holes with satisfactory fixation. Finally, it is possible to add a process for removing excess flux. High-accuracy solder balls can thus be formed.

In addition, the third semiconductor device of the present invention allows connection with the metal plate to be performed in a single operation and manufacturing to be facilitated without creating the need for covering the surface of the TAB substrate with an insulating film, because the semiconductor chip is mounted by direct bonding on the conductor pattern formation side of the TAB substrate, holes are formed in the insulating tape, and solder balls are fixed.

Furthermore, the method for manufacturing the fourth semiconductor device of the present invention improves productivity and facilitates manufacturing.

The fifth semiconductor device of the present invention improves support strength and results in very good heat radiation properties because the metal substrate is fixed to the area around the semiconductor chip on the TAB substrate. In addition, mounting is accomplished using an insulating tape, that is, a TAB substrate, in which a conductor pattern is formed on one surface, dispensing with the need for through hole plating or mask alignment between the patterns on the front and reverse surfaces, and limiting the operations to filling solder balls into holes formed in the insulating tape or in an insulating film that covers this tape, and to fixing the solder balls to the surface of the conductor pattern by heating or the like, thus facilitating the manufacture, improving the accuracy, and lowering the cost.

Preferably, mounting is made much easier by extending the TAB substrate over the semiconductor chip and electrically connecting the substrate to the semiconductor chip by means of direct bonding. It is also possible to connect the TAB substrate and the semiconductor chip using wire bonding.

The sixth semiconductor device of the present invention makes mounting very easy to accomplish and results in high reliability because an opening is formed in the chip mounting area of the insulating tape of the TAB substrate, the conductor pattern is extended into the opening, the extended pattern is directly bonded to the semiconductor chip, the conductor pattern formation side of this TAB substrate and the semiconductor chip areas are covered with an insulating film, and solder balls connected to the conductor pattern via contact holes formed in the insulating film are projected beyond the surface of the insulating film.

The seventh semiconductor device of the present invention is obtained by forming a resin sealant using a mold, thus making it possible to achieve a uniform and highly reliable resin seal and to manufacture a plurality of semiconductor devices at the same time.

Preferably, wiring holes are formed in the metal plate and insulating sheet in such a way that the wire bonding area of the conductor pattern becomes exposed, and the components are connected to the conductor pattern by wire bonding via these wiring holes, resulting in satisfactory connection.

In addition, a thin, stable, and highly reliable semiconductor device with good heat radiation properties can be provided by supporting a conductor pattern on a chip mounting substrate and sealing only the chip mounting side of the chip mounting substrate with a resin by performing molding.

The semiconductor chip can also be satisfactorily protected, and the length of the bonding wire shortened, by making the chip mounting substrate from a metal plate in which the chip mounting area is a recessed portion subjected to depress processing.

Yet another feature is that high support strength and reliability are obtained even when the chip mounting substrate is made of a metal flat plate.

The chip mounting substrate is preferably formed of a metal plate in which the chip mounting area is a recessed portion subjected to depress processing, with the result that the connection positions of the conductor pattern and semiconductor chip are close to each other, the bonding wire can be shortened when wire bonding is employed, connection is facilitated, and a highly reliable product is obtained.

In addition, because a plurality of perforated holes is formed around the recessed portion serving as a chip mounting area and suspension leads are provided, simple depress processing can be performed without causing deformation or strain.

DESCRIPTION OF THE PREFERRED EMBODIMENTS

The embodiments of the present invention will now be described in detail with reference to figures.

Figure 1:
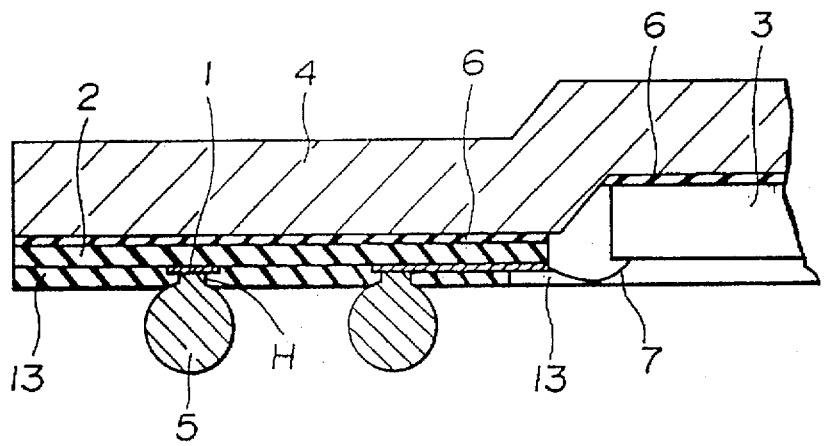
FIG. 1 is a diagram illustrating the semiconductor device of the first embodiment of the present invention.

As illustrated in FIG. 1, a distinctive feature of the semiconductor device pertaining to the first embodiment of the present invention is that the device comprises a metal substrate 4 having a recessed portion, a semiconductor chip 3 mounted in the recessed portion, a TAB substrate which is fixed to the metal substrate 4 so as to cover the recessed portion and which is equipped with a conductor pattern 1 on one surface connected with the semiconductor chip, and solder balls 5 protruding from a reverse side of the TAB substrate. The TAB substrate used in this case is obtained by forming the conductor pattern 1 on one side of an insulating tape 2 that has an opening in the chip mounting area. The metal substrate 4 in which the semiconductor chip 3 is mounted in the recessed portion is installed on the conductor pattern formation front side of this TAB substrate. In addition, the reverse side of the TAB substrate is covered with a polyimide resin film 13 having holes H, and solder balls 5 are projected beyond the polyimide resin film 13 and are positioned in such a way that they are connected to the aforementioned conductor pattern 1 on the front side via these holes H. In addition, the semiconductor chip 3 is connected to the conductor pattern 1 via a bonding wire 7 made of a gold. Furthermore, the metal substrate 4 is fixed along its circumferential edge portion to the TAB substrate with the use of an insulating adhesive 6 composed of a polyimide resin, and is also fixed to the semiconductor chip 3 in the recessed portion of the central region by this insulating adhesive. The holes H are formed entirely so as to be arranged in a grid-pattern-like formation.

Figure 2A:
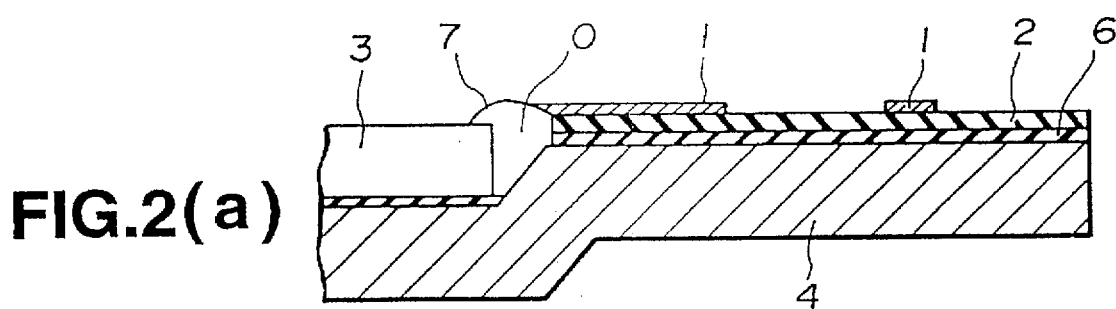
FIGS. 2(a) through 2(c) are diagrams illustrating the process for manufacturing the semiconductor device of the first embodiment of the present invention.
Figure 2B:
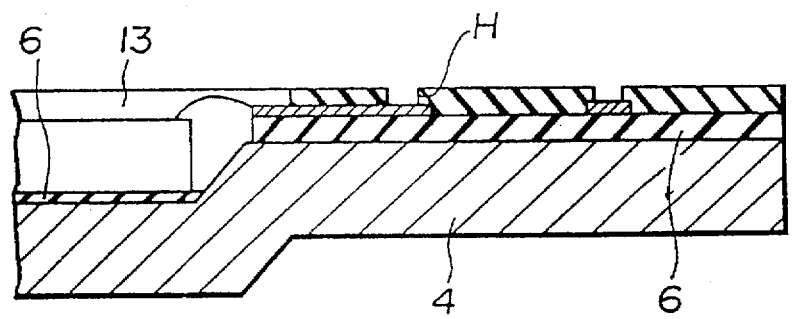
Figure 2C:
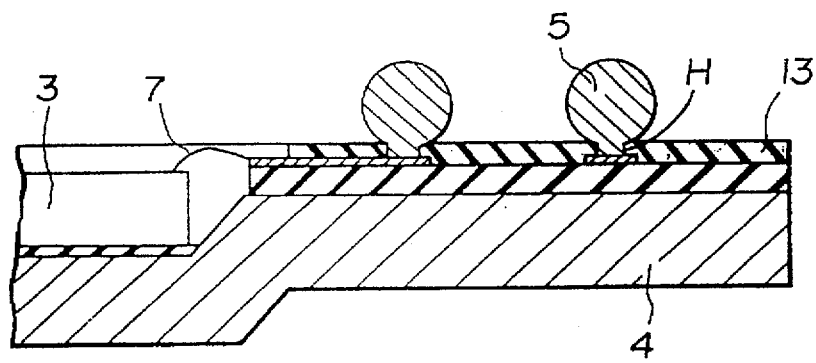

FIGS. 2(a) through 2(c) are process diagrams illustrating the manufacturing steps of this semiconductor device.

First, as illustrated in FIG. 2(a), depress processing is performed on the metal substrate 4 obtained by forming a nickel-plating layer on a copper plate, and the recessed portion is formed in the chip mounting area. An opening 0 is subsequently formed in the chip mounting area of the insulating tape 2 consisting of a polyimide resin and having a film thickness of 50 μm, a copper foil with a thickness of 18 μm is bonded and then patterned by photolithography, and a nickel-plating layer with a film thickness of 0.5 μm and a gold-plating layer with a film thickness of 0.5 μm are formed, yielding a TAB substrate having the conductor pattern 1. This TAB substrate is fixed to the flat portion of the aforementioned metal substrate 4 with the use of a polyimide resin 6 serving as an insulating adhesive. The semiconductor chip 3 is then fixed to the recessed portion of this metal substrate 4 with the use of the polyimide resin 6 serving as the insulating adhesive, and an electric connection is subsequently established between the conductor pattern 1 and the bonding pads of this semiconductor chip 3 via the bonding wire 7.

Next, as illustrated in FIG. 2(b), a polyimide resin film 13 is coated thereon to cover the entire semiconductor chip 3, and the holes H with a diameter of 0.65 mm are formed by photolithography at a pitch of 1.27 mm in such a way that the entire surface is covered with the holes arranged in a grid-pattern-like formation.

After that, as illustrated in FIG. 2(c), a flux is imprinted into these holes H, the solder balls 5 having a diameter of 0.7 mm and consisting of solder containing 10% lead and 90% tin are fed, and are heated at 320° C. for 10 seconds (time during which the peak temperature is maintained) to fix the conductor pattern 1 to the surface.

The assembly is finally dipped in isopropyl alcohol (IPA) as needed, and ultrasonic cleaning is performed to remove excess flux.

Inexpensive and highly accurate solder balls are thus formed.

In the above description, holes were formed after the polyimide resin film 13 had been coated, but it is also possible to bond a resin film in which holes have already been formed, or to form an insulating film by pattern printing. It is also permissible to form the polyimide resin film 13 on the TAB substrate 2 alone and to fill the semiconductor chip mounting area with a resin by potting.

The hole pitch or hole diameter is not limited by the aforementioned embodiment and can be suitably varied. It is, for example, possible to suitably change the hole diameter to 0.55 mm if the grid pitch is 1 mm, and to 0.75 mm if the grid pitch is 1.5 mm.

The composition of the solder balls can also be suitably selected. When, for example, a eutectic solder containing 37% lead and 63% tin is used, the heating temperature during the fixing process may be set to about 230° C.

A metal substrate was used in the aforementioned embodiment, but it is apparent that other materials such as an alumina substrate may also be used as long as the materials have satisfactory thermal conductivity.

In addition, as illustrated in FIG. 2(a), the aforementioned embodiment involves forming a nickel-plating layer on a copper plate and then performing depress processing, but it is also possible to form the nickel-plating layer following the depress processing.

Yet another feature is that the aforementioned embodiment involves forming a support substrate by drawing processing. Thus, the support substrate can be formed from a metal plate of substantially constant thickness, so that the support substrate has a thickness in the recessed chip mounting portion that is comparable with its thickness in the peripheral flat portion.

Figure 3:
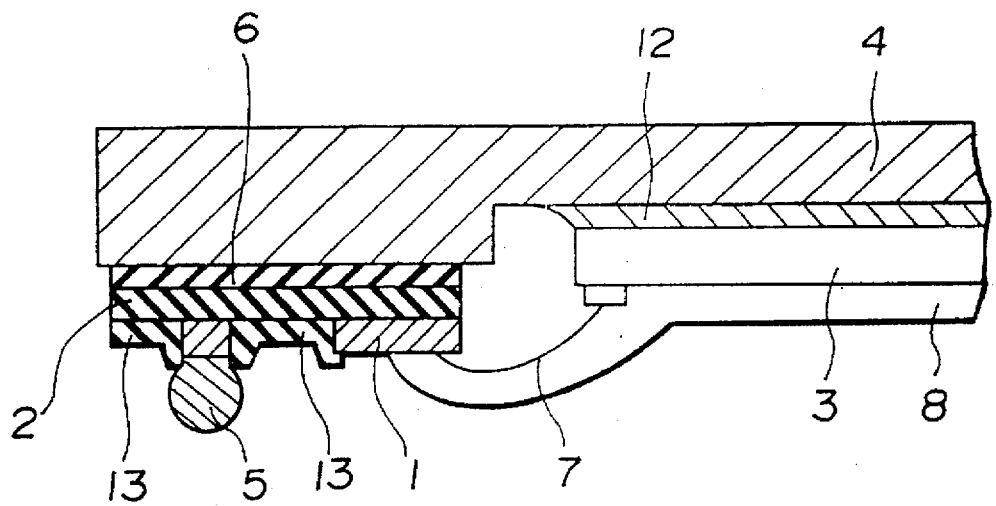
FIG. 3 is a diagram illustrating a modified example of the semiconductor device of the first embodiment of the present invention.

As illustrated by the modified embodiment in FIG. 3, it is also possible to use a metal substrate 4 having a counter bore formed by milling, in place of the recessed portion of the metal substrate 4. In this case, the connection between the semiconductor chip 3 and the metal substrate is formed from a conductive adhesive 12 called a silver paste. In addition, the aforementioned embodiment involved covering the front side of the semiconductor chip with a polyimide resin film 13 combined with a TAB substrate, but this embodiment involves covering with a potting resin 8 following the formation of the polyimide resin film 13.

Figure 4:
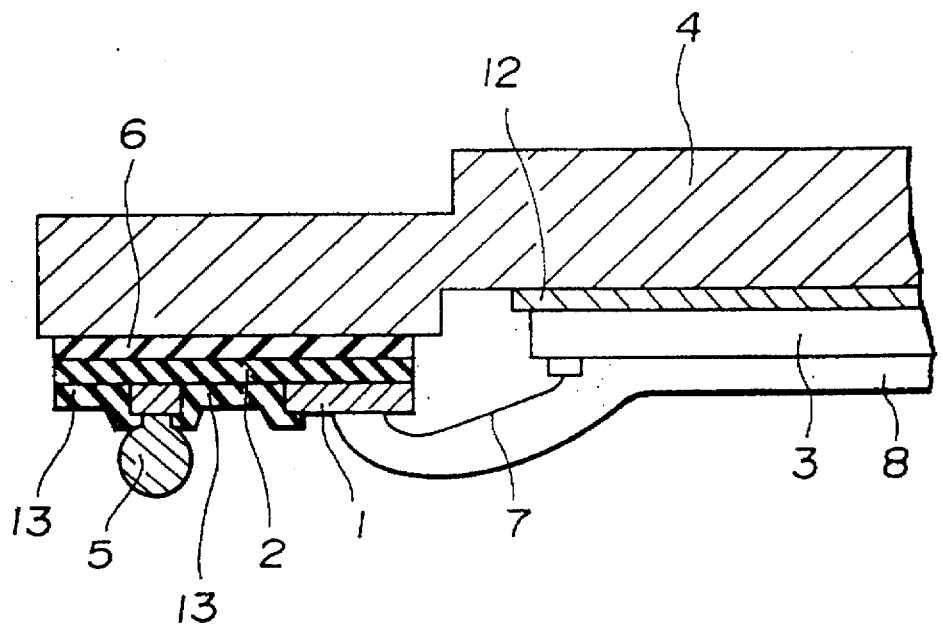
FIG. 4 is a diagram illustrating a modified example of the semiconductor device of the first embodiment of the present invention.

In addition, as illustrated in FIG. 4, a product obtained by forming a recessed portion after achieving a half blanking state by means of pressing may also be used as the metal substrate 4.

Figure 5:
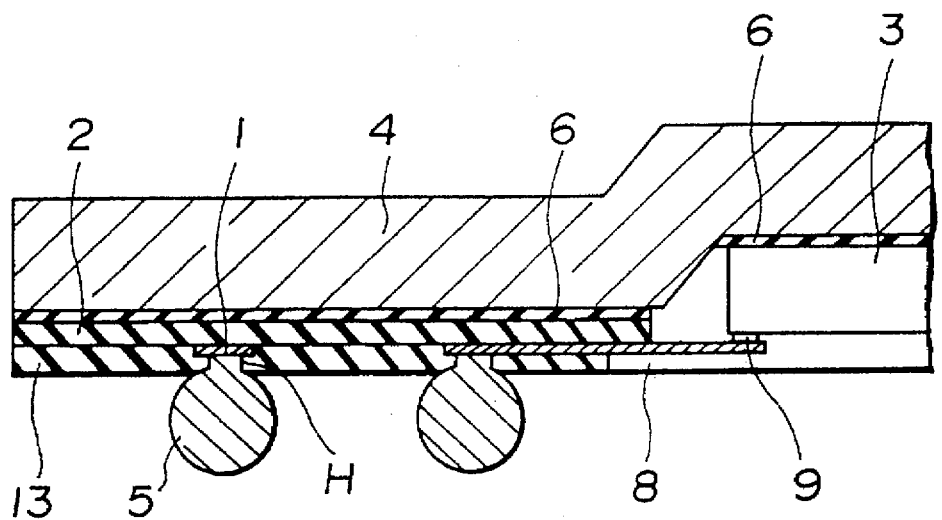
FIG. 5 is a diagram illustrating the semiconductor device of the second embodiment of the present invention.

A case of direct bonding will now be described as a second embodiment of the present invention. A distinctive feature of this embodiment is that direct bonding is used instead of the wire bonding employed in the first embodiment shown in FIG. 1. As illustrated in FIG. 5, the conductor pattern 1 extends above the bonding pads of the semiconductor chip 3 and is directly bonded to the bonding pads via a bump 9 formed on the tip, with all the other components being formed in the same manner as in the first embodiment described above. 8 is a potting resin composed of a polyimide resin or the like.

This structure makes mounting very easy to accomplish.

This embodiment makes it necessary to adjust the depth of the recessed portion, the thickness of the semiconductor chip, and other parameters, and to ensure that the surface is flat, but since the conductor pattern 1 used in this structure is flexible, small differences in depth are absorbed, and mounting becomes very easy to accomplish, making it possible to obtain an inexpensive and extremely reliable semiconductor device. Heat radiation properties are additionally improved by fixing the connection between the semiconductor chip and the metal substrate with the use of a conductive adhesive (called the silver paste) instead of the insulating adhesive.

There is no need to always use a polyimide resin for the resin film formed on the reverse side of the insulating tape, and a film composed of an epoxy resin or photosensitive resin may also be used. It is also possible to form the holes by pattern printing.

Figure 6:
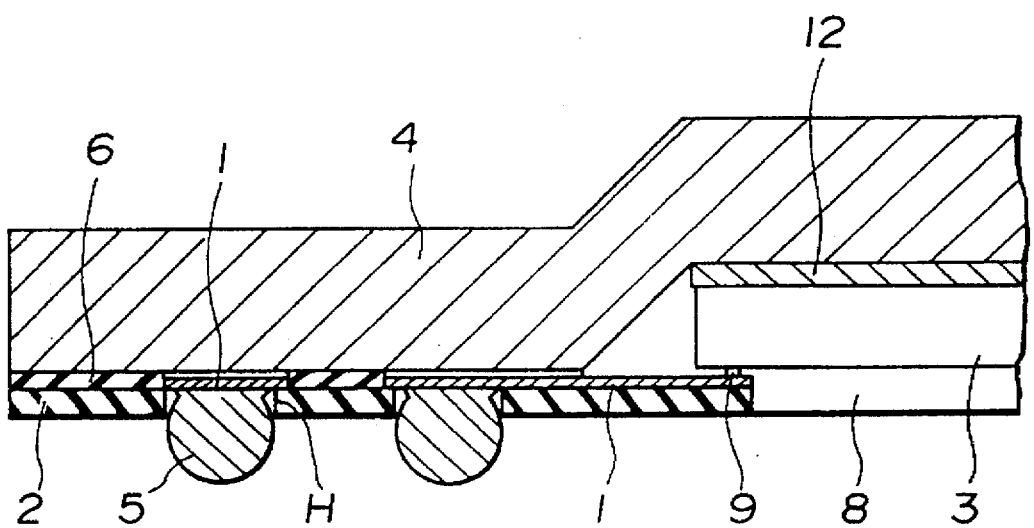
FIG. 6 is a diagram illustrating the semiconductor device of the third embodiment of the present invention.

Next, as illustrated in FIG. 6, a distinctive feature of the semiconductor device pertaining to a third embodiment of the present invention is that the formation surface of the conductor pattern 1 of the TAB substrate is placed on the same side as the semiconductor chip 3, the semiconductor chip is connected to the conductor pattern 1 by direct bonding, and solder balls are fixed to the conductor pattern 1 that is exposed inside the holes H formed in the insulating tape of this TAB substrate. In this case, the metal substrate 4 and the reverse surface of the semiconductor chip are fixed with the use of the silver paste 12 serving as a conductive adhesive. The metal substrate 4 and other components are formed in the same manner as in the first embodiment described above.

A process for manufacturing this semiconductor device will now be described.

Figure 7A:
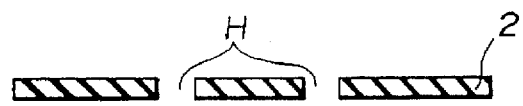
FIGS. 7(a) through 7(f) are diagrams illustrating the process for manufacturing the semiconductor device of the third embodiment of the present invention.

First, as illustrated in FIG. 7(a), holes H are perforated to form a grid pattern in a polyimide tape with a film thickness of 50 μm, yielding an insulating tape 2.

Figure 7B:
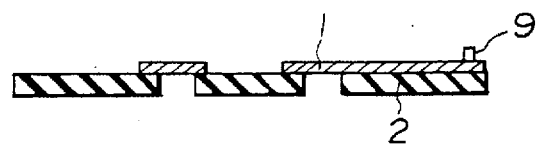

Next, as illustrated in FIG. 7(b), a copper foil is bonded with the use of an adhesive so as to cover the mouths of the holes H formed in this insulating tape, patterning is performed by photolithography, electroplating is then carried out to form a nickel layer and a gold layer on this copper pattern, yielding a conductor pattern 1 with a three-layer structure and forming a gold bump 9 in the bonding area. Because in this case the conductor pattern 1 is exposed inside the holes H, the product is a five-layer structure in which nickel layers and gold layers are formed on the two copper surfaces in this area.

Figure 7C:
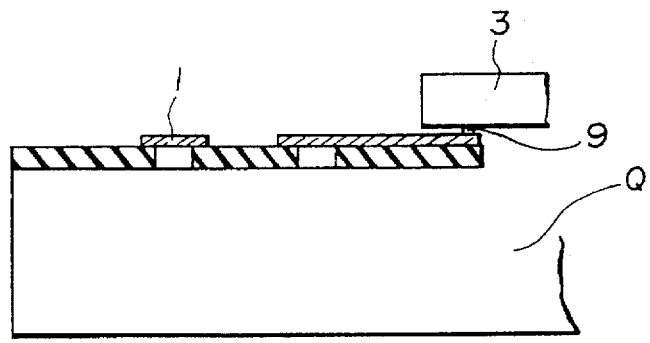

Next, as illustrated in FIG. 7(c), a support base Q is pressed against the insulating tape 2 side of the TAB substrate thus formed, positioning is performed in this reinforced state so as to attain alignment with the bonding pads of the semiconductor chip 3 on this conductor pattern, and the semiconductor chip 3 and the conductor pattern 1 on the TAB substrate are connected via the bump 9.

Figure 7D:
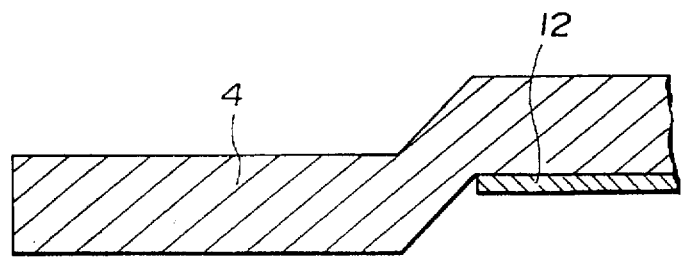

Meanwhile, as illustrated in FIG. 7(d), a product obtained in the following manner is prepared: a copper plate produced by forming nickel-plating layers on both surfaces is used as the metal substrate 4, a recessed portion is formed by a drawing technique in the semiconductor chip mounting area, a silver paste 12 is applied to the recessed portion of this metal substrate 4, and an insulating adhesive 6 composed of a polyimide resin is applied to the flat area along the peripheral edge of the recessed portion.

Figure 7E:
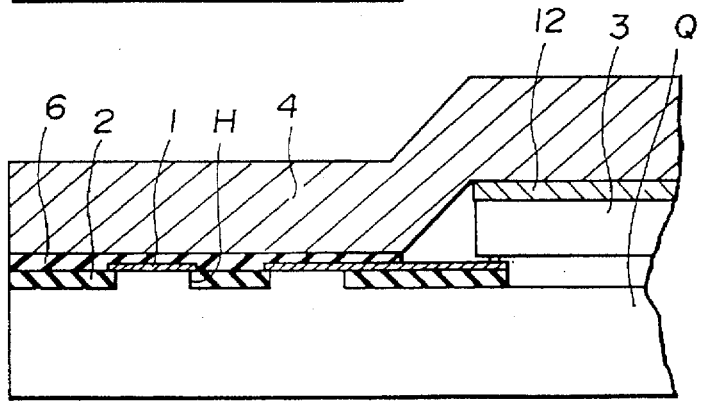

As illustrated in FIG. 7(e), this metal substrate 4 is positioned on the TAB substrate (on which the semiconductor chip 3 is mounted) and then heated under pressure. This fixes the metal substrate 4 to the semiconductor chip 3 and the TAB substrate. In this case, the TAB substrate is mounted on the base Q.

Figure 7F:
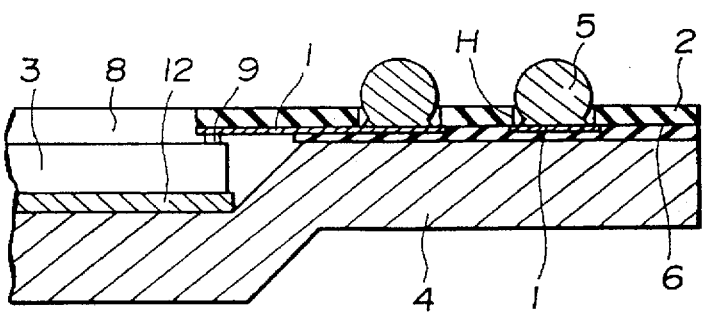

Finally, as illustrated in FIG. 7(f), the assembly is separated from the base Q and turned so that the TAB substrate faces upward; the semiconductor chip mounting area in the central portion is filled with the polyimide resin 8 or the like by means of potting or the like. Solder balls are then heated after being placed inside the holes made in the insulating tape, and these solder balls are thereby fixed to the conductor pattern 1. Because a gold layer covers even those conductor pattern surfaces that are exposed inside these holes, the reverse surface of the pattern is under the same conditions as the front side, ensuring satisfactory adhesion.

The semiconductor device thus formed is easy to manufacture, allows highly an accurate solder pattern to be formed, and is inexpensive.

Figure 8:
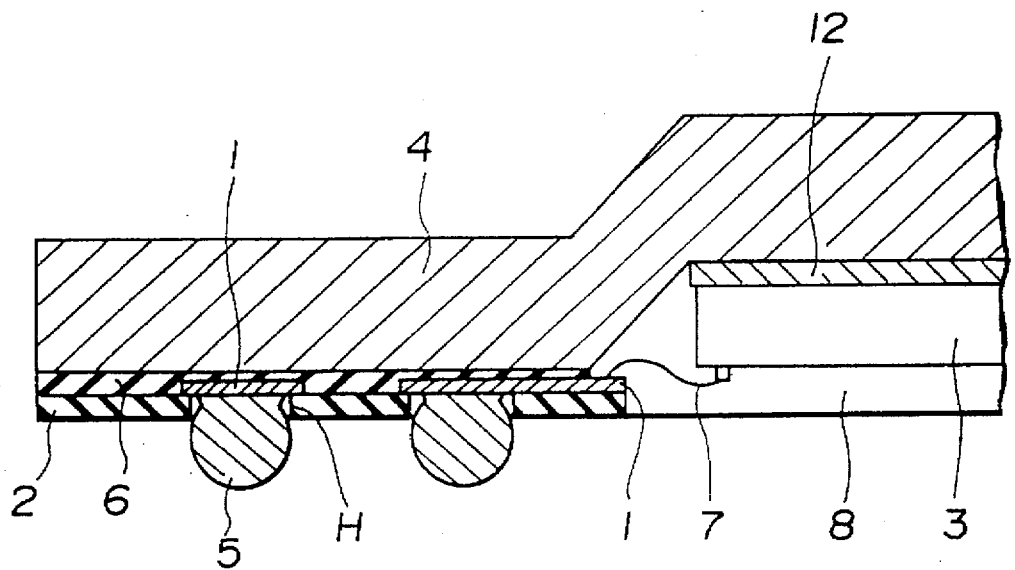
FIG. 8 is a diagram illustrating the semiconductor device of the fourth embodiment of the present invention.

The third embodiment described above involved formation by direct bonding, although the semiconductor chip and the conductor pattern may also be connected by wire bonding, as illustrated by the fourth embodiment shown in FIG. 8. In this case, connection is performed while the TAB substrate protrudes somewhat from the flat portion of the metal substrate 4 toward the recessed portion, and the conductor pattern 1 on that surface is connected to the semiconductor chip via the bonding wire 7. In this case, the TAB substrate (in which one end of the bonding wire has been connected in advance to the surface conductor pattern 1) is fixed to the metal substrate carrying the semiconductor chip, and the other end of this bonding wire is subsequently connected to the semiconductor chip side.

Figure 9:
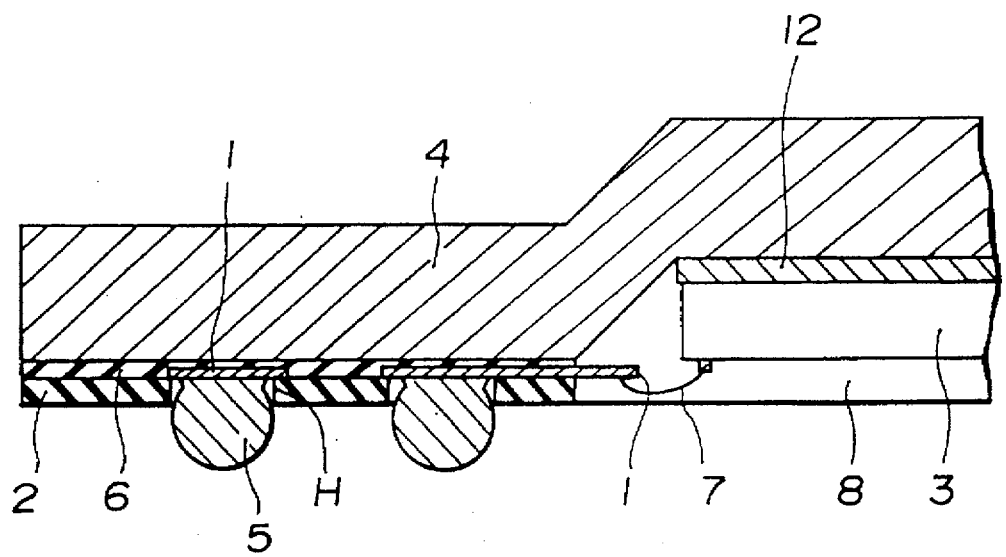
FIG. 9 is a diagram illustrating a modified example of the semiconductor device (FIG. 8) of the fourth embodiment of the present invention.

In addition, as illustrated in FIG. 9 depicting a modified embodiment, formation may also be performed while the conductor pattern 1 alone is in a protruding state. In this case bonding should follow the fixing of the TAB substrate to the metal substrate 4 carrying a semiconductor chip.

Figure 10:
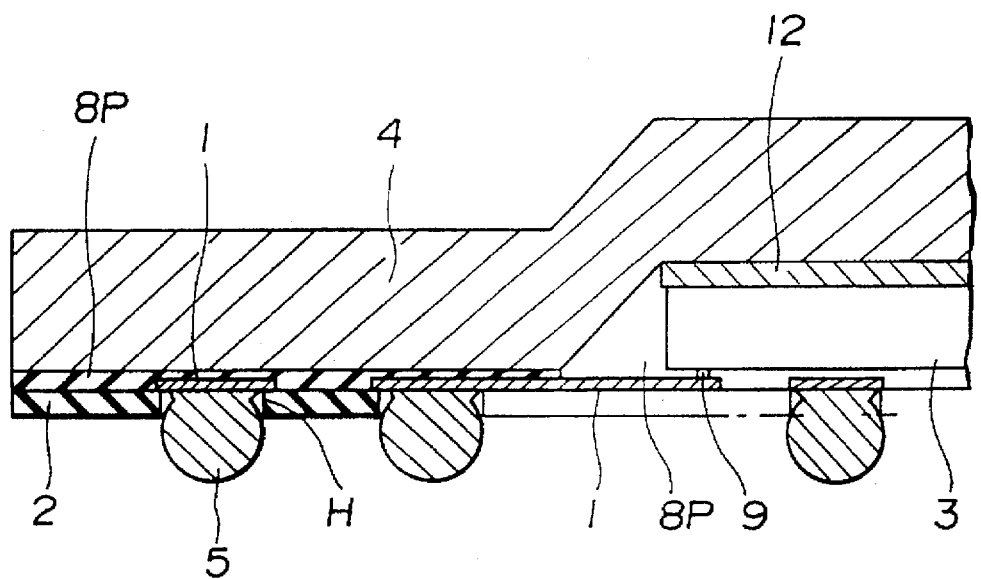
FIG. 10 is a diagram illustrating a modified example of the semiconductor device (FIG. 7) of the third embodiment of the present invention.

Furthermore, as illustrated in FIG. 10, which depicts a modification of the third embodiment shown in FIG. 6, the surface including the recessed portion of the metal substrate 4 may also be covered with a TAB substrate. In this case, the semiconductor chip 3 is mounted on the metal substrate 4, the recessed portion along the circumferential edge of the semiconductor chip 3 and the surface of the semiconductor chip (excluding the bonding pads) are coated with a heat-shrinkable resin 8p in an amount sufficient to fill up the recessed portion, the TAB substrate is positioned in such a way that the conductor pattern 1 formation surface faces inward, and thermosetting is performed under pressure. Solder balls are then formed in the same manner. This makes it possible to obtain a highly reliable semiconductor device very easily.

A fourth embodiment of the present invention will now be described.

Figure 11:
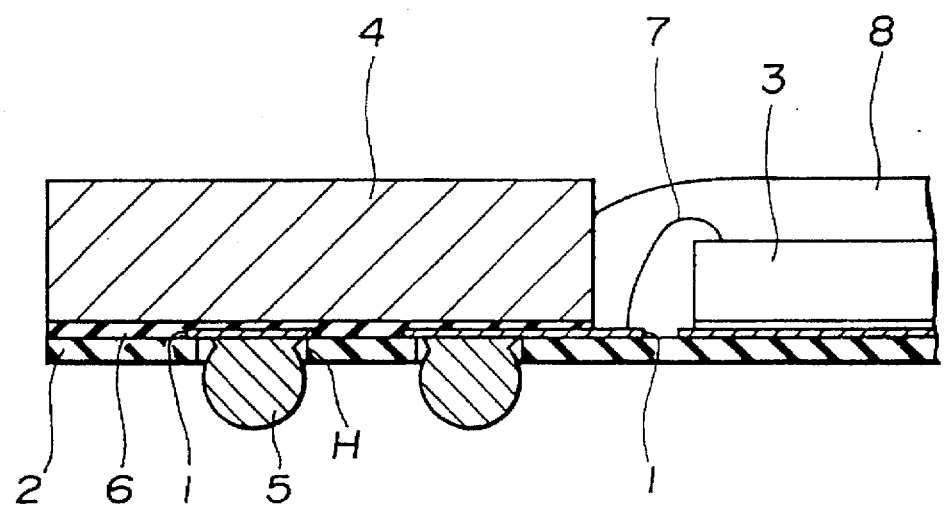
FIG. 11 is a diagram illustrating the semiconductor device of the fourth embodiment of the present invention.

As illustrated in FIG. 11, a distinctive feature of the semiconductor device pertaining to the fourth embodiment of the present invention is that a semiconductor chip is mounted on the conductor pattern formation side of a TAB substrate consisting of an insulating tape 2 (itself consisting of a polyimide resin on one side of which a conductor pattern 1 is formed), a metal substrate 4 is mounted so that it surrounds this semiconductor chip, and solder balls 5 are formed on the reverse side. The semiconductor chip 3 is connected to the conductor pattern 1 via a bonding wire 7 formed of gold, and is covered entirely with a potting resin 8 consisting of a polyimide resin together with the bonding wire. In addition, the TAB substrate has holes H, and solder balls 5 are projected beyond the reverse side in such a way that they are connected to the aforementioned conductor pattern 1 on the front side via these holes. The semiconductor chip 3 and the metal substrate 4 are connected to the TAB substrate by an insulating adhesive 6 consisting of a polyimide resin. In addition, the holes H are formed on the entire surface of the insulating tape in such a manner that the holes are arranged in a grid-pattern-like formation.

Figure 12A:
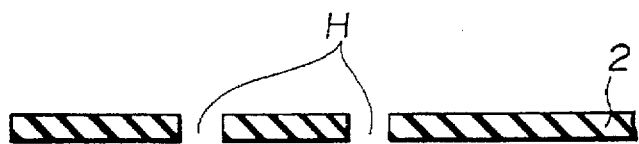
FIGS. 12(a) through 12(c) are diagrams illustrating the process for manufacturing the semiconductor device of the fourth embodiment of the present invention.
Figure 12B:
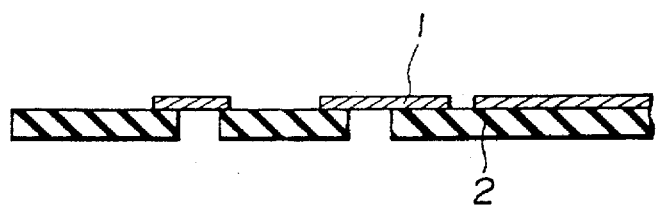
Figure 12C:
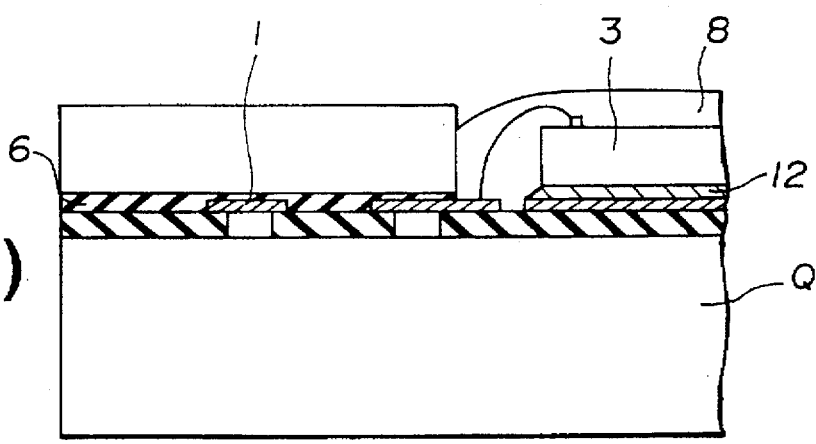

FIGS. 12(a) through 12(c) are process diagrams illustrating the manufacture of this semiconductor device.

First, as illustrated in FIG. 12(a), holes H with a diameter of 0.65 mm are perforated at a pitch of 1.27 mm to form a grid pattern in an insulating tape 2 composed of a polyimide resin with a film thickness of 50 µm, yielding the insulating tape 2.

Next, as illustrated in FIG. 12(b), a copper foil with a thickness of 18 µm is bonded to the surface of this insulating tape, the copper foil is then patterned by photolithography so as to cover the mouths of the holes H formed in this insulating tape, electroless plating is subsequently carried out to form a nickel layer and a gold layer, each with a thickness of 0.5 µm, on this copper pattern, yielding a conductor pattern 1 with a three-layer structure. Because in this case the conductor pattern 1 is exposed inside the holes H, the product is a five-layer structure in which nickel layers and gold layers are formed on the two copper surfaces in this area.

Next, as illustrated in FIG. 12(c), a support base Q is pressed against the insulating tape 2 side of the TAB substrate thus formed, and a frame-shaped metal substrate 4 formed of a metal plate covered with a nickel-plating layer is fixed under heat and pressure to the conductor pattern with the use of an insulating adhesive 6 composed of polyimide. A semiconductor chip 3 is meanwhile fixed in the same manner to the inside of the metal substrate 4 with the use of the insulating adhesive 6. The semiconductor chip 3 and the conductor pattern 1 are connected together by means of wire bonding to achieve the electrical connection, potting is then performed using a polyimide resin (potting resin 8) to cover the bonding wire 7 and the semiconductor chip 3, and the assembly is fixed and protected.

After that, a flux is imprinted into the holes M of the insulating tape 2, solder balls 5 having a diameter of 0.7 mm and consisting of solder containing 10% lead and 90% tin are fed, and the assembly is heated at 320° C. for 10 seconds (time during which the peak temperature is maintained) to fix the conductor pattern 1 to the surface.

The assembly is finally dipped in isopropyl alcohol (IPA) as needed, and ultrasonic cleaning is performed to remove excess flux.

Inexpensive and highly accurate solder balls are thus formed.

The hole pitch or hole diameter is not limited by the aforementioned embodiment and can be suitably varied. It is, for example, possible to suitably change the hole diameter to 0.55 mm if the grid pitch is 1 mm, and to 0.75 mm if the grid pitch is 1.5 mm.

The composition of the solder balls can also be suitably selected. When, for example, a eutectic solder containing 37% lead and 63% tin is used, the heating temperature during the fixing process may be set to about 230° C.

A copper substrate was used in the aforementioned embodiment, but it is apparent that other materials with satisfactory thermal conductivity such as an alumina substrate may be used.

Figure 13:
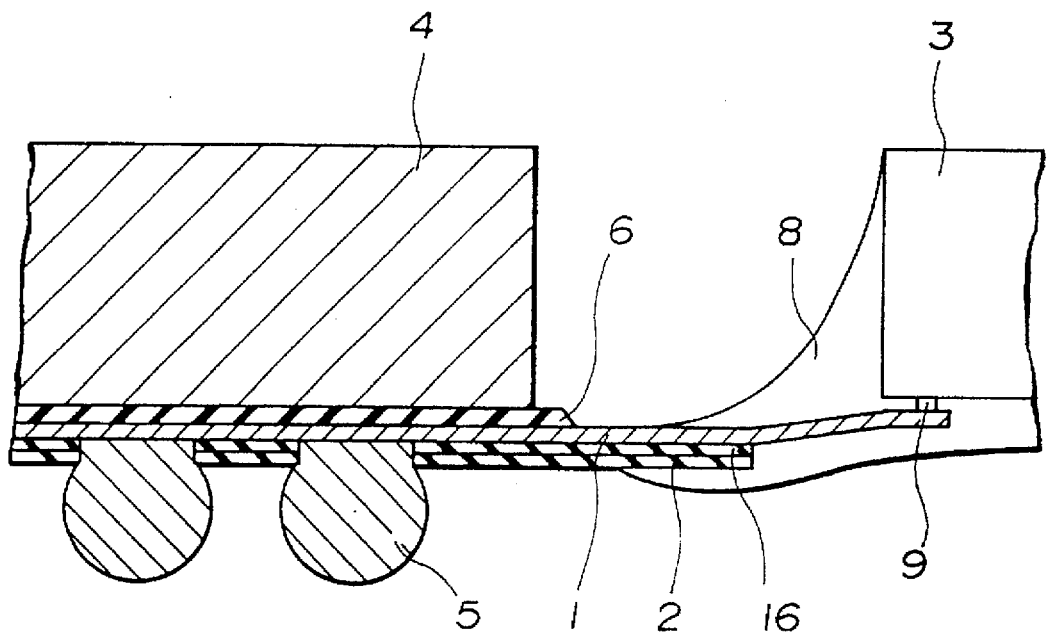
FIG. 13 is a diagram illustrating the semiconductor device of the fifth embodiment of the present invention.

A case of direct bonding will now be described as a fifth embodiment of the present invention. A distinctive feature of this embodiment is that a substrate having holes in the chip mounting area is used as the TAB substrate in the fourth embodiment shown in FIG. 11, and that direct bonding is used instead of wire bonding. As illustrated in FIG. 13, the conductor pattern 1 and the bonding pads of the semiconductor chip 3 are directly bonded via a bump 9, and the circumference of the semiconductor chip 3 is fixed with a potting resin 8. All the other components are formed in the same manner as in the first embodiment described above.

This structure makes mounting very easy to accomplish.

Heat radiation properties are additionally improved by insulating and covering the conductor pattern only in the necessary areas and fixing the connection between the semiconductor chip and the metal substrate with the use of a conductive adhesive called the silver paste instead of the insulating adhesive.

There is no need to always use a polyimide resin as the potting resin, and a film composed of an epoxy resin or other resin may also be used.

Figure 14:
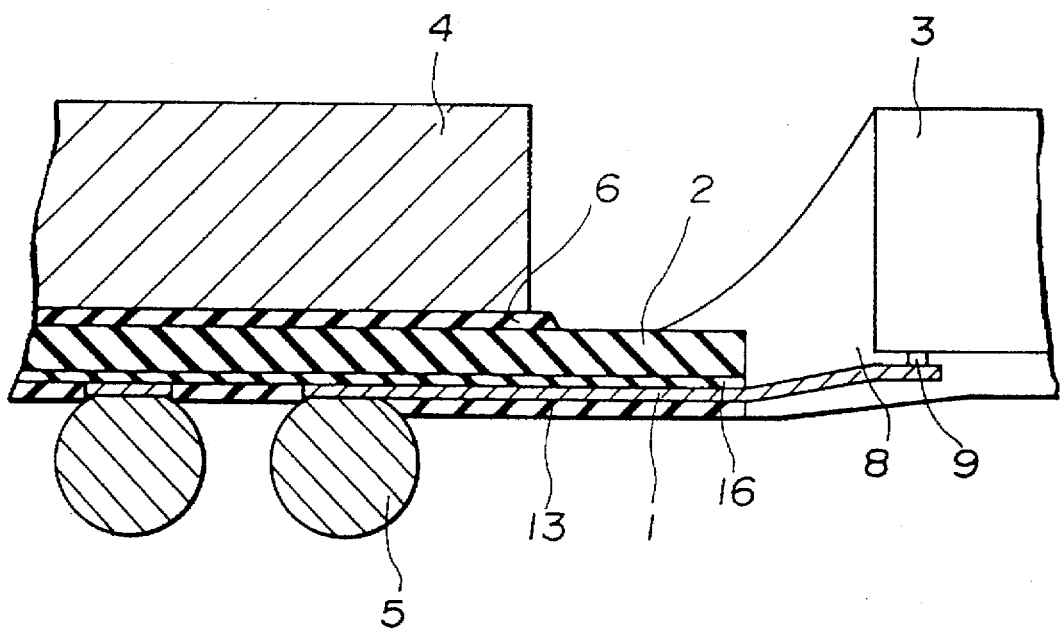
FIG. 14 is a diagram illustrating the semiconductor device of the sixth embodiment of the present invention.

Next, as illustrated in FIG. 14, the semiconductor device pertaining to a sixth embodiment is obtained by mounting a metal substrate 4 and a semiconductor chip 3 on the insulating tape side of a TAB substrate, extending a conductor pattern 1 directly above the bonding pads of the semiconductor chip 3, and bonding the semiconductor chip 3 by direct bonding to the conductor pattern 1. An insulating film 13 is then applied to the conductor pattern 1 formation side of this TAB substrate in such a way that the semiconductor chip 3 is also covered, holes H are formed in this insulating film, and solder balls 5 are formed in such a way that they are connected to the conductor pattern 1 exposed inside the holes H. In this case, the metal substrate 4 is fixed with the use of an insulating adhesive 6. The bump 9, metal substrate 4, and other components are formed in the same manner as in the fifth embodiment described above.

A process for manufacturing this semiconductor device will now be described.

Figure 15A:
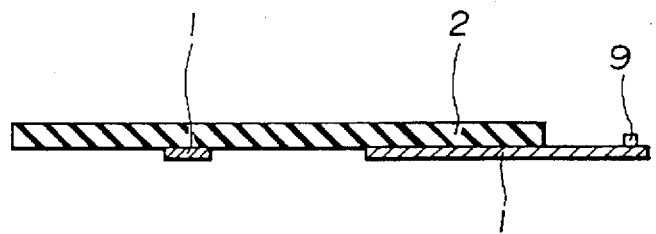
FIGS. 15(a) and 15(b) are diagrams illustrating the process for manufacturing the semiconductor device of the sixth embodiment of the present invention.

As shown in FIG. 15(a), a copper foil with a thickness of 18 μm is first bonded to a polyimide tape with a film thickness of 50 μm and then patterned by photolithography, and a nickel-plating layer with a film thickness of 0.5 μm and a gold-plating layer with a film thickness of 0.5 μm are formed, yielding a TAB substrate having a conductor pattern 1. At this point a bump 9 is formed by plating on the tip of the conductor pattern.

Figure 15B:
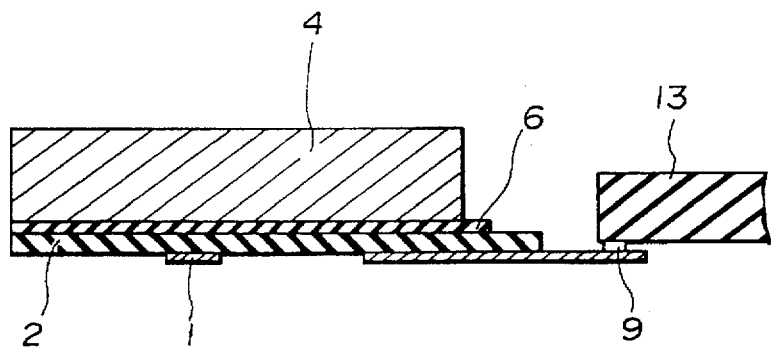

Next, as illustrated in FIG. 15(b), a base (not shown) is pressed against the conductor pattern 1 formation side of the TAB substrate thus formed, positioning is performed in this reinforced state so as to attain alignment with the bonding pads of the semiconductor chip 3 on the bump 9 of this conductor pattern 1, and the semiconductor chip 3 and the conductor pattern 1 on the TAB substrate are connected to each other. The metal substrate 4 is then positioned on the TAB substrate on which the semiconductor chip 3 has been mounted, and is fixed by being heated under pressure.

Finally, the assembly is filled with a potting resin 8, separated from the base Q, turned so that the TAB substrate faces upward, and coated with a polyimide resin 13 in such a way that the aforementioned semiconductor chip 3 is completely covered. Holes H with a diameter of 0.65 mm are formed by photolithography at a pitch of 1.27 mm in such a way that the holes are arranged in a grid-pattern-like formation on the entire surface. After that, a flux is imprinted into these holes H, solder balls 5 having a diameter of 0.7 mm and consisting of solder containing 10% lead and 90% tin are fed, and are heated at 240° C. for 10 seconds (time during which the peak temperature is maintained) to fix the surface to the conductor pattern 1.

The assembly is finally dipped in isopropyl alcohol (IPA) as needed, and ultrasonic cleaning is performed to remove excess flux.

The semiconductor device thus formed is easy to manufacture, allows highly an accurate solder pattern to be formed, and is inexpensive.

A film obtained by first applying the polyimide resin 13 and then forming holes was used as the insulating film in the above embodiment, but it is also possible to bond a resin film in which holes have been formed in advance.

A seventh embodiment of the present invention will now be described.

Figure 16:
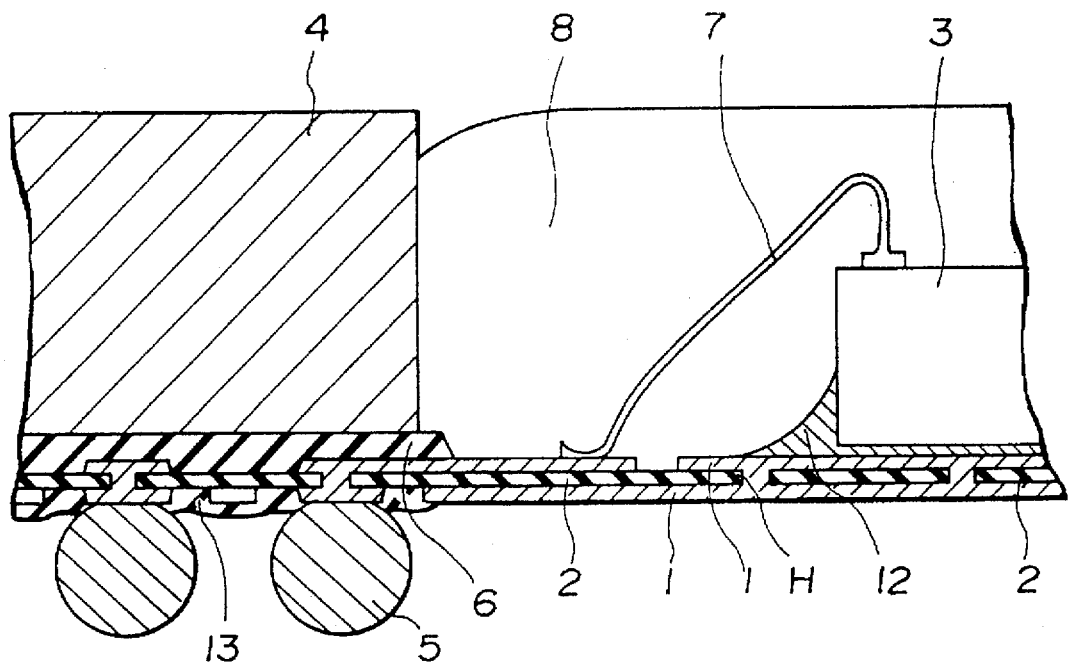
FIG. 16 is a diagram illustrating the semiconductor device of the seventh embodiment of the present invention.

As illustrated in FIG. 16, a distinctive feature of this semiconductor device is that a substrate obtained by forming conductor pattern 1 on both sides of an insulating tape is used as the TAB substrate, the conductor patterns are electrically connected to the reverse surface via through holes H in the chip mounting portion, and the conductor patterns in the chip mounting area are used as a ground plate. The semiconductor chip 3 and the TAB substrate are electrically connected to each other via a bonding wire 7, and the conductor pattern 1 and solder balls 5 are used to effect outside connection. In addition, a semiconductor chip is connected to the conductor pattern 1 of the TAB substrate with the use of a silver paste (electroconductive adhesive 12). 8 is a potting resin, and 13 is an insulating film used to cover and protect the conductor pattern 1 on the reverse side.

This structure preserves the effects of the embodiments described above and possesses satisfactory heat radiation properties. There is no particular need to form solder balls for a ground line output. The area that constitutes the ground plate may also be directly fixed to the mounting substrate with the use of an electroconductive paste to facilitate mounting operations during the mounting of components on the mounting substrate.

Figure 17:
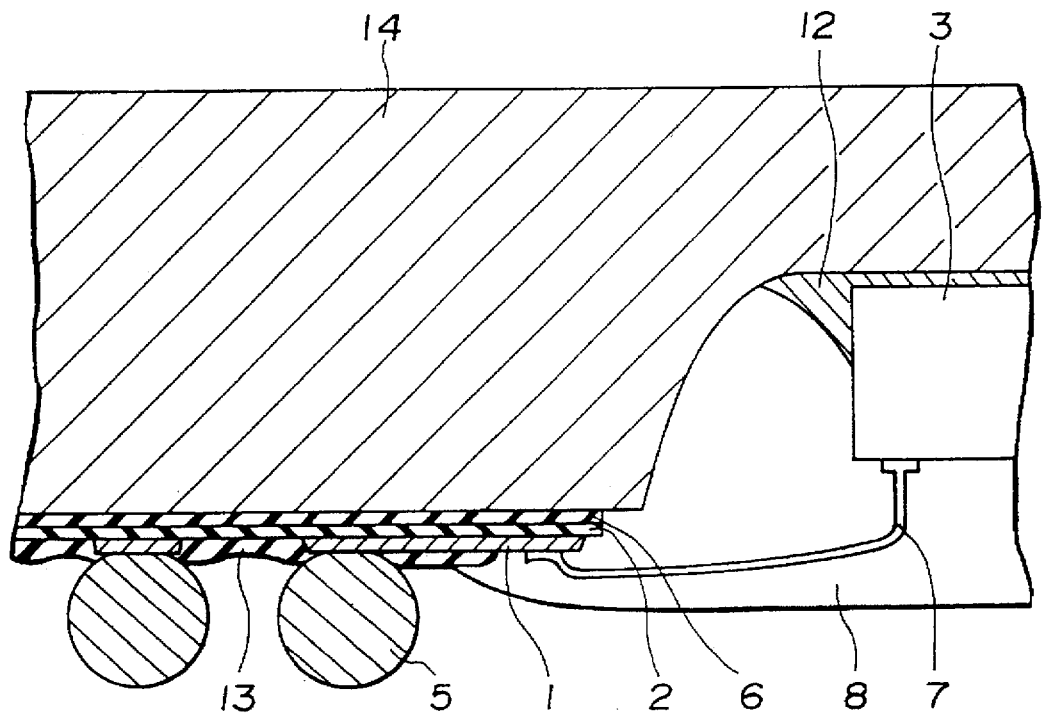
FIG. 17 is a diagram illustrating the semiconductor device of the eighth embodiment of the present invention.

In an eighth embodiment of the present invention, as illustrated in FIG. 17, a cap-shaped copper plate 14 having a recessed portion in the chip mounting area formed by means of half etching may be used as the metal substrate, and a semiconductor chip 3 may be fixed to this recessed portion with the use of an electroconductive adhesive 12. The semiconductor chip 3 and the conductor pattern 1 of the TAB substrate are connected together by a bonding wire 7, and the TAB substrate is bonded to the metal substrate 14 by an insulating adhesive 6 in such a way that conductor pattern 1 formation side faces outward. In addition, the conductor pattern 1 is covered and protected by an insulating film 13.

This structure, in addition to affording the aforementioned effects, facilitates manufacturing and improves the heat radiation properties.

Figure 18:
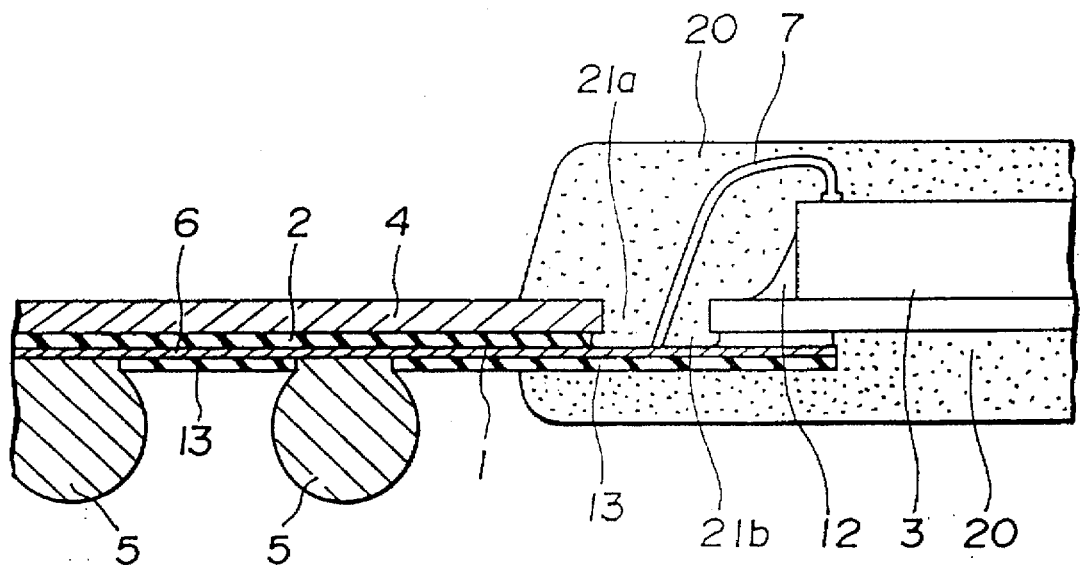
FIG. 18 is a diagram illustrating the semiconductor device of the ninth embodiment of the present invention.

Next, as illustrated in FIG. 18, the semiconductor device pertaining to a ninth embodiment of the present invention is characterized by comprising the following components: a metal substrate 4 in which a chip mounting area is formed in the center, a semiconductor chip 3 mounted in this chip mounting area, a TAB substrate bonded to the reverse side of the metal substrate and composed of an insulating tape 2 in which a conductor pattern 1 is formed on the surface, solder balls 5 that project out beyond the reverse side of the TAB substrate, and a resin sealing container 20 molded using a mold in such a way that the semiconductor chip is covered. In this case, the TAB substrate is obtained by forming a conductor pattern 1 on one surface of the insulating tape 2. With this TAB substrate, the surface located on the insulating tape side is bonded to the metal substrate 4, wiring holes 21a and 21b are formed in the metal substrate 4 and insulating tape 2 in areas corresponding to the bonding areas of the conductor pattern 1, and the conductor pattern 1 is exposed inside these wiring holes 21a and 21b. In addition, the reverse side of the TAB substrate is covered with a polyimide resin film 13 perforated with holes H, and solder balls 5, which are arranged in such a way that they are connected to the aforementioned conductor pattern 1 on the front side through these holes H, are projected beyond the polyimide resin film 13. Furthermore, the semiconductor chip 3 is connected to the conductor pattern 1 via a bonding wire 7 formed of gold. In addition, the metal substrate 4 is bonded to the TAB substrate with the use of an insulating adhesive 6 composed of a polyimide resin and, by its central portion, to the semiconductor chip 3 with the use of an electroconductive adhesive 12.

Figure 19:
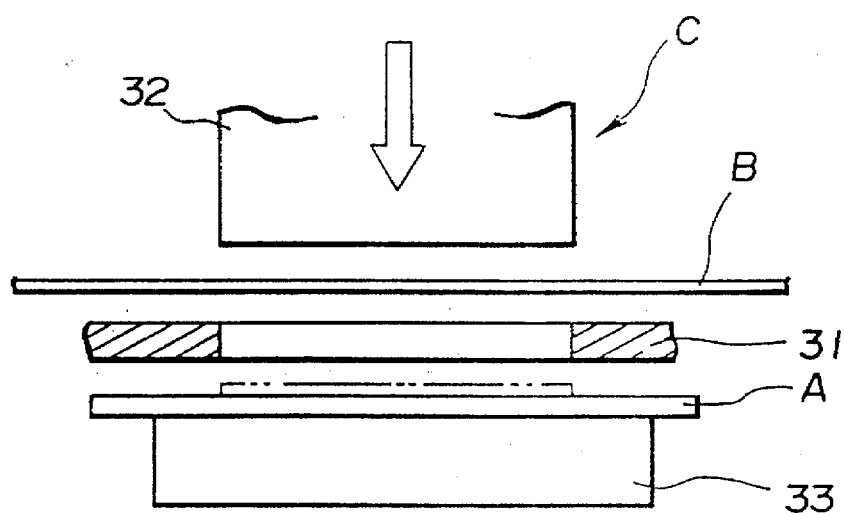
FIG. 19 is a diagram illustrating a modified example of the semiconductor device (FIG. 17) of the ninth embodiment of the present invention.
Figure 20:
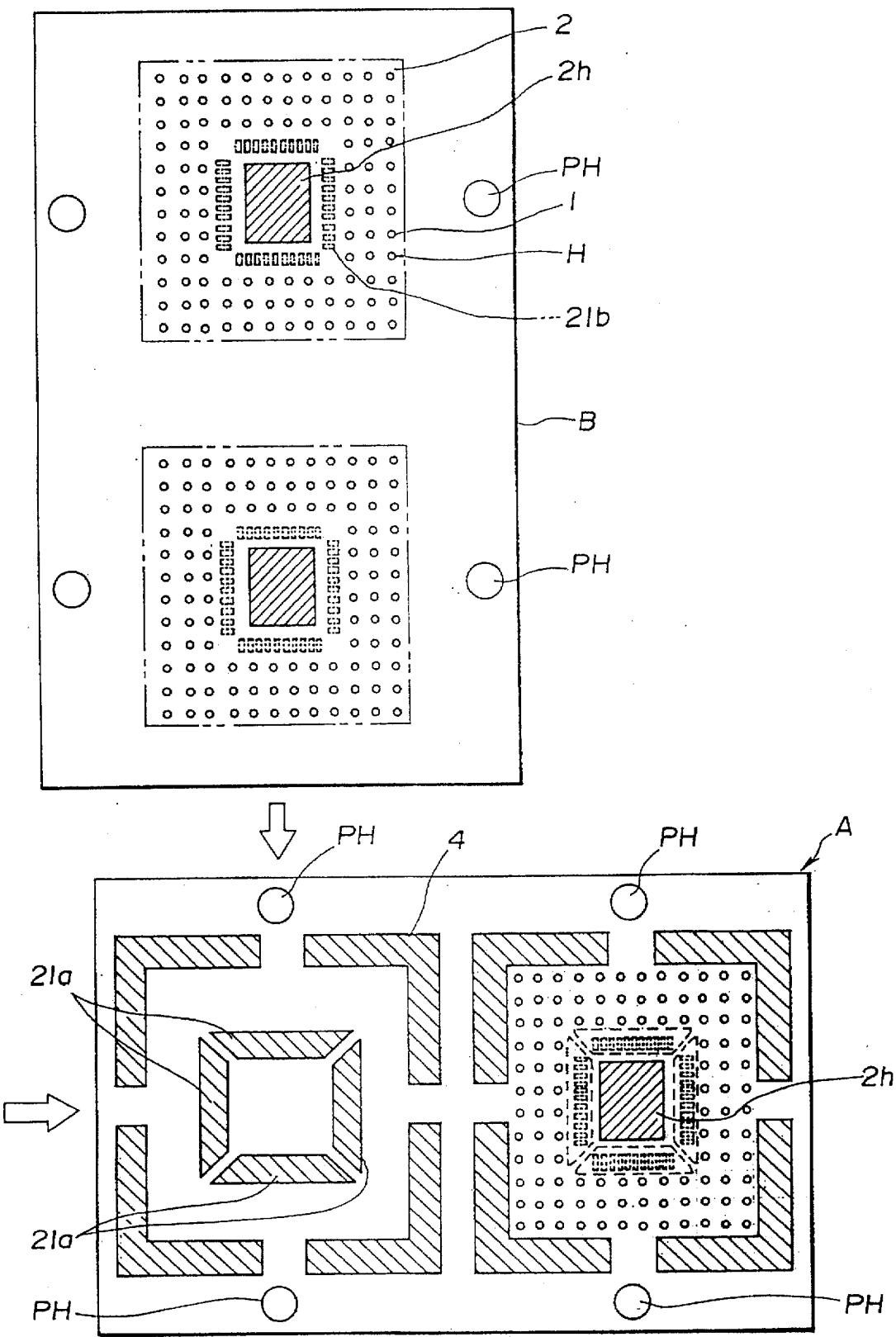
FIG. 20 is a diagram illustrating the process for manufacturing the semiconductor device of the ninth embodiment of the present invention.

FIGS. 19 and 20 are diagrams illustrating the process for manufacturing this semiconductor device.

First, a copper foil with a thickness of 18 μm is patterned by photolithography after being bonded to an insulating tape 2 in the form of a polyimide tape with a film thickness of 50 μm, and a nickel-plating layer with a film thickness of 0.5 μm and a gold-plating layer with a film thickness of 0.5 μm are then formed, yielding a TAB substrate having a conductor pattern 1. In the process, a wiring hole 21b is formed in the insulating tape 2, and the conductor pattern 1 within an area (broken line) corresponding to the bonding area is exposed (broken line). The upper layer is additionally covered by a polyimide resin film 13 perforated with holes H so as to cover the conductor pattern 1. This polyimide resin film 13 may be formed by screen printing, by a method in which application is followed by photolithographic patterning, or by other method. In the process, the insulating tape is removed and a hole 2h is formed to improve the heat radiation properties in the semiconductor chip mounting area. The conductor pattern 1 spans the insulating tape 2 and the polyimide resin film 13 and is exposed inside the hole 2h.

A strip A carrying sequentially arranged metal substrates 4 having pressed or etched wiring holes 21a or other formations of prescribed shape obtained in advance is transported in a predetermined direction, a strip B carrying sequentially arranged TAB substrates is transported in a direction orthogonal to the direction in which the strip A is transported, a pressing apparatus C is placed in the exact position corresponding to the portions intersecting at right angles, and a TAB substrate is punched out from the strip B by a die 31 and a punch 32 and pressed against a predetermined section of the underlying metal substrate 4. In this case, the metal substrate 4 is heated by an underlying heater 30, an adhesive is applied to the bonding surface of the TAB substrate, and the TAB substrate is tacked on in a prescribed position of the metal substrate 4. Because tacking alone produces insufficient bonding, the TAB substrate and the metal substrate 4 are fully bonded under heat and pressure when the metal substrate 4 is fed to the next process. In FIG. 20, the hatched portions indicate punched holes (perforated holes), and PH indicate pilot holes.

A semiconductor chip (semiconductor integrated circuit chip) 3 is bonded with the use of an electroconductive adhesive in the resulting chip mounting area of the center of the resultant semiconductor chip mounting substrate, and the semiconductor chip 3 is electrically connected via a bonding wire 7 to a conductor pattern 1 exposed within wiring holes 21 (21a and 21b). An area to be molded is put into the mold, and an epoxy resin is injected for resin sealing.

Finally, solder balls 5 are formed by cream soldering or the like in the holes H that appear to form a grid pattern, and the assembly is separated from the strip to complete the fabrication of a resin-sealed semiconductor device.

Figure 21:
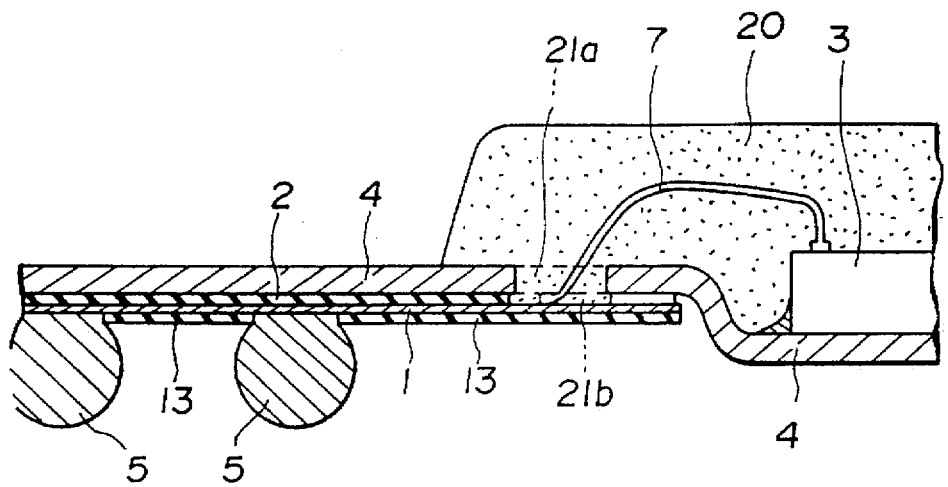
FIG. 21 is a diagram illustrating the semiconductor device of the tenth embodiment of the present invention.

Next, as illustrated in FIG. 21, which shows a tenth embodiment of the present invention, the device may be made thinner by depressing the metal substrate 4 downward to thereby lower the mounting position of the semiconductor chip 3, a sealing resin 20 may be formed on only one surface and the metal substrate 4 may be exposed. The other components are formed in the same manner as in the ninth embodiment described above.

This structure allows the bonding wire 7 to be shortened and the heat radiation properties to be improved.

Figure 22:
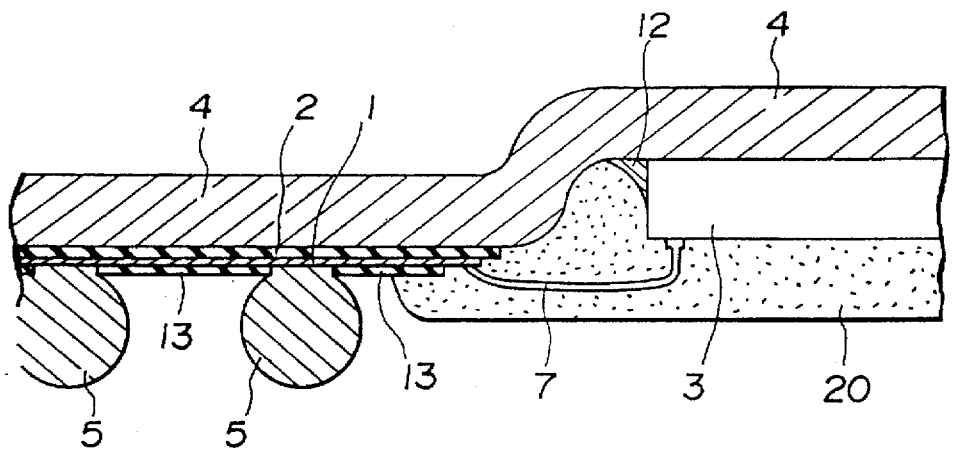
FIG. 22 is a diagram illustrating the semiconductor device of the eleventh embodiment of the present invention.

In a yet another, eleventh, embodiment of the present invention, as shown in FIG. 22, a semiconductor chip 3 is mounted in a recessed portion formed by depressing the metal substrate 4 upward (unlike in the tenth embodiment described above), and is made almost level with the conductor pattern 1, making it possible to minimize the size of the bonding wire. It is also possible to enclose this recessed portion side with a resin sealing container 20 using a mold. This approach is the same as that adopted in the first embodiment described above, except that a resin sealing container is formed using a mold instead of the potting resin 8. 12 is an electroconductive adhesive.

Because this structure is obtained using a mold, mass production is facilitated and mechanical strength is improved. Heat radiation properties are also improved because of the use of a structure in which the entire surface of the metal substrate is exposed.

Figure 23:
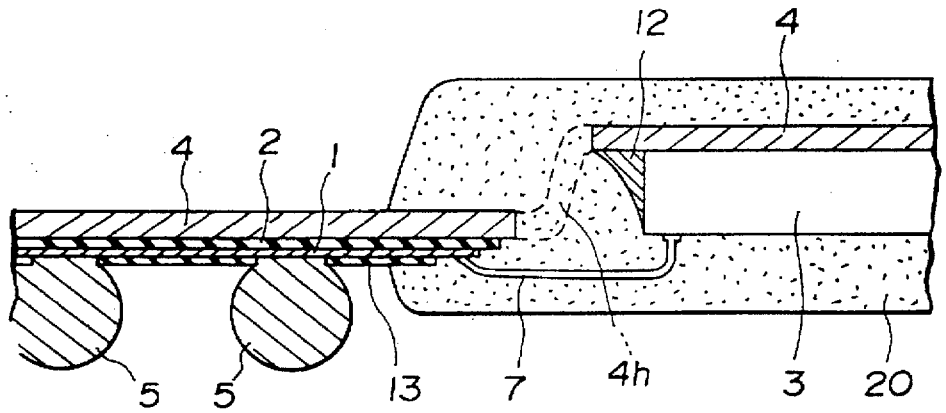
FIG. 23 is a diagram illustrating the semiconductor device of the twelfth embodiment of the present invention.
Figure 24:
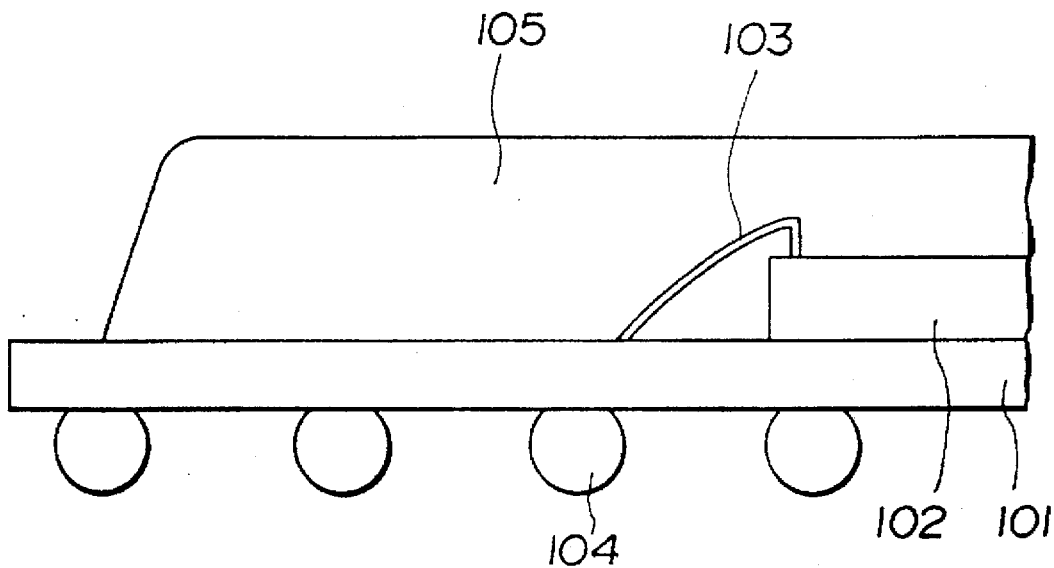
FIG. 24 is a diagram illustrating a conventional example of a semiconductor device.
Figure 25:
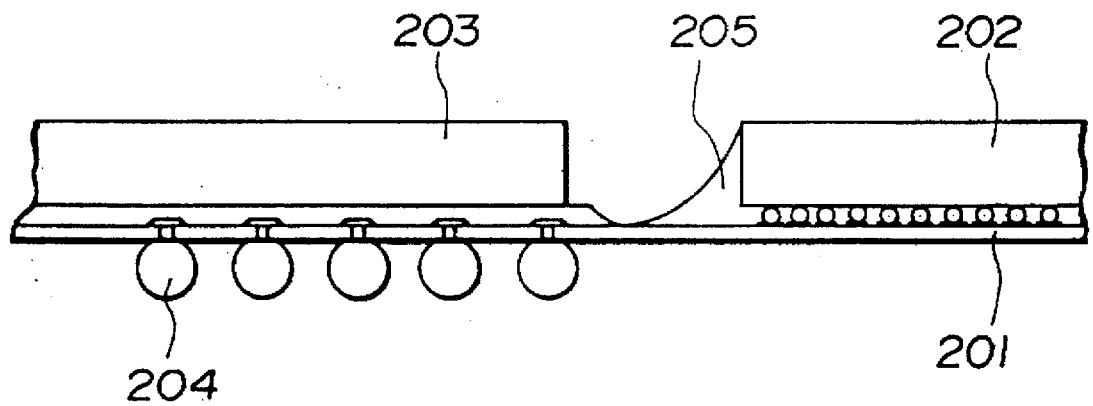
FIG. 25 is a diagram illustrating a conventional example of a semiconductor device.

Strain tends to remain when irregularities are formed on the metal substrate 4, but, as shown in FIG. 23 illustrating a twelfth embodiment, punched holes 4h may be formed in advance in the circumferential edge portions of the chip mounting area of the metal substrate 4. In such a case, the resin sealing container 20 covers not one but two surfaces.

Embodiments involving the use of wire bonding were described above with reference to the ninth through twelfth embodiments, but it is apparent that these embodiments are not limited to the wire bonding and may involve the use of direct bonding.

In addition, the embodiments described above involved dipping the assemblies in isopropyl alcohol (IPA) and performing ultrasonic cleaning to remove excess flux during the formation of solder balls, but the cleaning is not necessarily ultrasonic, and a cleaning solution can also be suitably selected.

What is claimed is:

1. A semiconductor device comprising:

a constant-thickness, strip metal, thermally conductive support substrate having a recessed portion serving as a chip mounting area and a peripheral flat portion surrounding the recessed portion, said peripheral and recessed portions both having front and back surfaces, the recessed portion front surface being recessed in relation to the peripheral flat portion front surface, while the recessed portion back surface is raised in relation to the peripheral portion back surface;

a semiconductor chip fixed to the recessed portion of the support substrate with the use of an adhesive;

a TAB substrate formed of an insulating tape having one and the other opposed surfaces, said TAB substrate carrying on the one surface, multiple conductor patterns electrically connected to the semiconductor chip, the other surface of the insulating tape being fixed on the peripheral flat portion of the support substrate over a continuous area of the TAB substrate surface opposing the multiple conductor patterns;

an insulating film covering the conductor patterns and being formed with contact holes extending through the insulating film in the vicinity of the conductor patterns; and multiple solder balls, each connected to a corresponding one of the conductor patterns via a corresponding one of the contact holes formed in the insulating film and each projecting beyond the insulating film, said peripheral flat portion of said substrate overlying said solder balls; wherein wiring holes are formed in the metal plate substrate and the insulating tape in such a way that a wire bonding area of each conductor pattern is exposed; and the semiconductor chip is connected to the conductor patterns by means of wire bonding via the wiring holes.

2. A semiconductor device as defined in claim 1, further comprising a resin sealing container molded using a mold so that the semiconductor chip and at least a portion of the conductor patterns are covered.

3. A semiconductor device as defined in claim 2, wherein the resin sealing container is formed on one side only of the front surface of the substrate.

4. A semiconductor device as defined in claim 3, wherein the chip mounting area of the metal plate substrate is a recessed portion formed by depress processing.

5. A semiconductor device as defined in claim 3 wherein the chip mounting area in the metal plate substrate is a recessed portion formed by depress processing, and wherein the metal plate substrate has a plurality of removed portions around the recessed portion whereby remaining portions of the metal plate provide suspension leads.

6. A semiconductor device as defined in claim 2, wherein the chip mounting area of the metal plate substrate is a recessed portion formed by depress processing.

7. A semiconductor device as defined in claim 2 wherein the chip mounting area in the metal plate substrate is a recessed portion formed by depress processing, and wherein the metal plate substrate has a plurality of removed portions around the recessed portion whereby remaining portions of the metal plate provide suspension leads.

8. A semiconductor device as defined in claim 1, wherein the chip mounting area of the metal plate substrate is a recessed portion formed by depress processing.

9. A semiconductor device as defined in claim 1, wherein the chip mounting area in the metal plate substrate is a recessed portion formed by depress processing, and wherein the metal plate substrate has a plurality of removed portions around the recessed portion whereby remaining portions of the metal plate provide suspension leads.

* * * * *